United States Patent

Bonnemay

[11] 4,117,540
[45] Sep. 26, 1978

[54] COMPUTING MODULE

[75] Inventor: Alain Bonnemay, Saclay, France

[73] Assignee: Commissariat a l'Energie Atomique, Paris, France

[21] Appl. No.: 759,199

[22] Filed: Jan. 13, 1977

[30] Foreign Application Priority Data

Jan. 14, 1976 [FR] France .................. 76 00878

[51] Int. Cl.² .......................... G06J 1/00; G06G 7/12
[52] U.S. Cl. .................................... 364/602; 364/605; 364/807
[58] Field of Search ...................... 235/150.5, 193, 184, 235/150.52, 151.1, 151.34, 156; 307/229; 364/602, 605, 807, 841, 715, 510

[56] References Cited

U.S. PATENT DOCUMENTS 2,978,178  4/1961  Patterson .................. 235/193
3,017,106  1/1962  Patterson .................. 235/194
3,686,490  8/1972  Goldstone .................. 235/156

OTHER PUBLICATIONS

Korn & Korn-*Electronic Analog and Hybrid Computers*-1964, McGraw-Hill, Inc.-pp. xiii to xxiii.

*Primary Examiner*—Joseph F. Ruggiero

[57] ABSTRACT

The computing module comprises a group of three circuits each intended to perform an elementary operation on the input signals and consisting of a summing circuit for receiving the signals $E_1$ and $E_2$ and delivering the sum signal $S_1 = E_1 + E_2$, a subtracter for receiving the signals $E_1$ and $E_2$ and delivering the difference signal $S_2 = E_1 - E_2$ and a multiplier for receiving the signals $E_1$ and $E_3$ and delivering the product signal $S_3 = E_1E_3$, as well as a fourth circuit for performing a non-elementary operation on the input signals and delivering the signals $S_4$.

10 Claims, 4 Drawing Figures

COMPUTING MODULE

This invention relates to a computing module and finds an application in the field of electronics and especially in the construction of hybrid computers and functional units which can be employed for example in process control and/or regulating operations.

The computing module in accordance with the invention has three inputs to which there can be applied input signals designated throughout the following description by the references $E_1$, $E_2$, $E_3$ respectively and four outputs on which appear signals designated below by the references $S_1$, $S_2$, $S_3$, $S_4$ respectively. This module is characterized in that it comprises:

- a group of three circuits each intended to perform an elementary operation on the input signals and constituted respectively by: a summing circuit for receiving the signals $E_1$ and $E_2$ and delivering the sum signal $S_1 = E_1 + E_2$, a subtracter for receiving the signals $E_1$ and $E_2$ and delivering the difference signal $S_2 = E_1 - E_2$ and a multiplier for receiving the signals $E_1$ and $E_3$ and delivering the product signal $S_3 = E_1 E_3$,
- a fourth circuit for carrying out a non-elementary operation on the input signals and delivering the signal $S_4$.

The input signals can be analog signals which may possibly be variable or logical signals. In some cases, certain input signals can be of an analog type and other signals can be of a logical type. The circuits for performing the operations on these input signals can in turn be either of an analog type or of a logical type or alternatively of a hybrid analog-logical type. In consequence, the output signals are also either of a logical or analog type or alternatively of a hybrid type. The computing module in accordance with the invention therefore carries out a series of algebraic, logical or hybrid functions.

In accordance with the definition given in the foregoing, the fourth circuit performs an operation which is not elementary insofar as it consists neither of an addition nor of a subtraction nor a multiplication in the algebraic sense of these terms nor of an OR, an AND or a NOT in the logical sense of these terms. The fourth circuit can therefore assume a large number of different forms and each of these forms makes it possible to carry out a wide range of different functions.

By way of explanation and not in any limiting sense, this circuit can carry out on the three input variables $E_1$, $E_2$, $E_3$, the operation which is expressed algebraically by: $S_4 = E_1 + E_2 - E_1 E_3$. But in another alternative form, said circuit can perform the operation $S_4 = E_1 + E_2 - 2E_1 E_2$ which corresponds in logical language to the exclusive-OR; or alternatively the operation $S_4 = 1 - E_1 E_2$ which corresponds in logical language to the NAND or alternatively the operation $S_4 = 1 - E_1 - E_2 + E_1 E_2$ which corresponds in logical language to the NOR.

The distinctive features and advantages of the invention will in any case become apparent from the following description of one exemplified embodiment which is given by way of explanation and not in any limiting sense, reference being made to the accompanying drawings, wherein.

Figure 1:
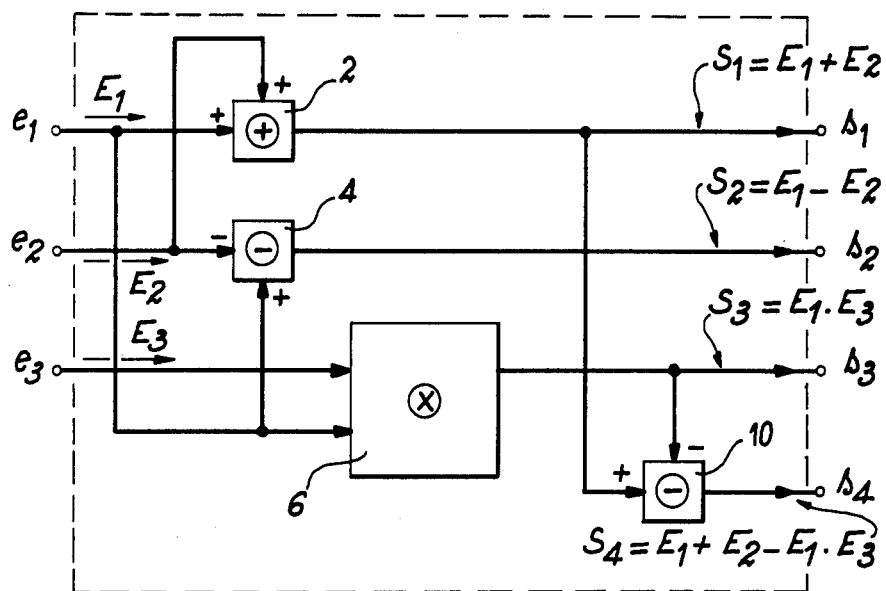
FIG. 1 is a general schematic diagram of the computing module in accordance with the invention.

The general arrangement of the computing module M in accordance with the invention is illustrated in FIG. 1. This module has three inputs $e_1$, $e_2$, $e_3$ and four outputs $s_1$, $s_2$, $s_3$, $s_4$.

A first group of three circuits comprises the circuits 2, 4 and 6. The circuit 2 is a summing circuit which receives the signals $E_1$, $E_2$ and delivers the sum signal $S_1 = E_1 + E_2$ on the output lead $S_1$; the circuit 4 is a subtracter which receives the signals $E_1$ and $E_2$ and delivers the difference signal $S_2 = E_1 - E_2$ at the output $s_2$; the circuit 6 is a multiplier which receives the signals $E_1$ and $E_3$ and delivers the product signal $S_3 = E_1 E_3$ on the output lead $s_3$.

The module M further comprises a fourth circuit 10 which carries out a non-elementary operation on the input signals. By way of explanation but not in any limiting sense in the case of FIG. 1, this fourth circuit is a subtracter which receives the signal $S_1 = E_1 + E_2$ delivered by the summing circuit 2 and the signal $S_3 = E_1 E_3$ delivered by the multiplier 6. The subtracter 10 then delivers the difference signal $S_4 = E_1 + E_2 - E_1 E_3$ at the output $s_4$. If this operation is elementary with respect to the signals $S_1$ and $S_3$, said operation is not elementary with respect to the input signals, which is wholly in accordance with the definition given earlier.

A module of this type in which no provision is made for any internal switching is programmed simply by applying voltages to the inputs. If certain outputs and in particular the output $s_4$ are connected electrically to the inputs, the module is capable of carrying out a large number of functions either of an analog type or of a logical type or alternatively of a hybrid analog-logical type.

The table which appears at the end of this specification gives a non-exhaustive list of functions selected from the most important functions which can be performed by means of the computing module in accordance with FIG. 1. The first column of the table indicates the nature of the operation performed and the second column indicates the operation proper; there are indicated in the group consisting of the first three columns the signals $E_1$, $E_2$, $E_3$ which are intended to be applied to the inputs $e_1$, $e_2$, $e_3$ and there are indicated in the following group consisting of the last four columns the signals $S_1$, $S_2$, $S_3$ and $S_4$ which appear at the outputs $s_1$, $s_2$, $s_3$, $s_4$.

The algebraic signals are designated by letters in lower-case italics such as $x$ and $y$ for example and the logical signals are designated by lower-case Greek letters such as $\lambda$ and $\mu$, for example. When a signal on one input is indifferent, it has the notation $\phi$; this means that the signal does not produce any action in the operation considered and can consequently be of any type.

In order to obtain certain operations, the signal which has to be applied to one of the inputs must be pre-processed. These cases are indicated by an asterisk in the table given hereinafter. This pre-processing operation can always be carried out by another module of the same type. For example, in order to put in the inactive state a gate which receives an analog signal $x$ and a logical signal $\lambda$, it is necessary to produce beforehand the sum signal $1 + x$ which must be applied to the input $e_3$.

It should finally be noted in this table that the logical operations are represented by the usual signs, namely a point for the AND operation, a $v$ for the OR operation and a top line for the NOT operation.

The table under consideration shows that the module in accordance with the invention makes it possible to obtain the main elementary functions, namely on the one hand the algebraic functions (addition, subtraction, multiplication and inversion) and on the other hand logical functions (AND, OR and NOT); this is apparent when taking into account not only the structure of the circuit shown in FIG. 1 but also the non-elementary operations such as division or extraction of a square root or alternatively the hybrid functions such as that of putting a gate in the operating position for permitting the transmission of an analog signal under the control of a logical signal or putting a gate in the inactive position.

By reason of the existence of four outputs and of the indifferent character of certain inputs, certain operations are compatible or in other words can be carried out simultaneously by the same computing module. It is thus possible to carry out simultaneously the operation of addition on signals $x$ and $y$ applied to the inputs $e_1$ and $e_2$ and the operation of multiplication of $x$ by $y$ by also applying the signal $y$ to the input $e_3$. It is also possible to carry out simultaneously an operation of algebraic subtraction between two signals $x$ and $y$ applied to the inputs $e_1$ and $e_2$ and the operation of activating a gate for receiving the analog signal $x$ and the logical signal $\lambda$.

These operations which are compatible with each other are designated by an index which varies from (1) to (6) so that all the operations designated by the same index can be associated with each other.

The main advantage of the computing module in accordance with the invention lies in the fact that it permits a high degree of standardization of equipment since all algebraic, logical or logical-algebraic operations can be performed by means of this single module. Moreover, the fact that it performs all these functions without any internal switching ensures good reliability of the module. In addition, the module offers three principal advantages over the numerical technologies which are usually met with in this field, viz:

the parallel character of operations, this being related to the presence of four outputs, the extreme simplicity of couplings between modules which are limited to leads, the possibility of operating without any need for special programming on quantities which are subject to variations in time.

The computing module under consideration finds an application mainly in two fields:

(a) in the construction of a hybrid computer: when associated with circuits having non-linear characteristics (function generator, comparators, integrators), modules in accordance with the invention can be grouped together in a computer which has two distinctive features:

the logical and analog portions are combined so as to form a single assembly, connecting-up can readily be made automatic by reason of the fact that the modules are practically identical.

(b) in the construction of functional units for electronic regulation and control systems: one example of an arrangement of this type will now be given by way of explanatory illustration.

It will be assumed that use is made of a steam generator having an inflow rate Q which is set by means of a general control at a value $Q_C$ and that it is desired to carry out the following orders:

if a given reference temperature $T_C$ is not attained by the steam, the reference flow rate $Q_C$ should be reduced by a quantity $\eta Q_C$, where the value of $\eta$ has been determined beforehand, if a water level $N_C$ is no longer maintained, the reference flow rate should be increased by the same quantity $\eta Q_C$, priority of the second order over the first should be ensured, in the event that these two situations do not arise in either case, the reference flow rate $Q_C$ should be maintained.

Figure 2:
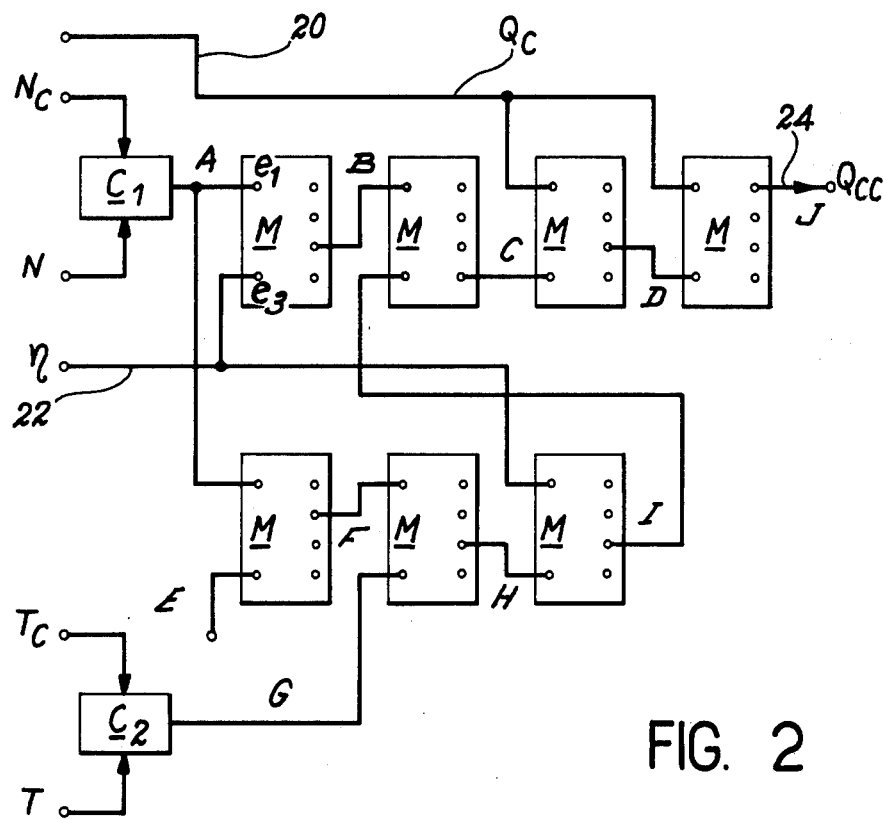
FIG. 2 is a block diagram showing a functional control and regulating unit constructed by means of modules in accordance with the invention.

This problem of control can be solved by means of a processor which combines seven computing modules in accordance with the invention as illustrated in FIG. 2. In this processor diagram, the comparator $C_1$ receives the reference value $N_C$ and the measured value N of the water level; said comparator delivers a logical signal $\lambda_1$ which is equal either to 0 or to 1, depending on whether the level N is higher or lower than the reference value $N_C$. A second comparator $C_2$ receives the reference value $T_C$ in respect of the temperature and the value T of the measured temperature; said comparator delivers a logical signal $\lambda_2$ which is equal either to 0 or to 1, depending on whether the measured temperature is either higher or lower than the reference value. The reference value $Q_C$ of inflow rate is applied to the processor through the lead 20 and the quantity $\eta$ is applied to the lead 22.

The processor which is illustrated in FIG. 2 comprises seven modules M in accordance with the invention as shown more particularly in FIG. 1. These modules are connected to each other as shown in the figure. In this circuit, the inputs $e_2$ and $e_3$ of the modules are connected together since the signals $E_2$ and $E_3$ applied thereto are always equal. In order to simplify the diagram, the modules M only have two inputs, namely the top input $e_1$ and the bottom input $e_3$. The corrected reference value $Q_{CC}$ is finally delivered via the output lead 24 in accordance with prescribed orders. In order to check this, it is possible to follow the different stages of the operations performed by the processor by examining the nature of the signals which appear on certain leads designated by the references A, B, C ... I, J. On the lead A, there appears the signal $\lambda_1$; on B the signal $\lambda_1 \eta$; on C the signal $(\lambda_1 \eta) v (-\overline{\lambda}_1 \cdot \lambda_2 \cdot \eta)$; on E the signal 1; on F the signal $-\overline{\lambda}_1$; on G the signal $\lambda_2$; on H the signal $-\overline{\lambda}_1 \cdot \lambda_2$; on I the signal $-\overline{\lambda}_1 \cdot \lambda_2 \cdot \eta$. There finally appears on the output lead the signal $Q_{CC} = Q_C(1 + \eta)$ if $\lambda_1 = 1$, the signal $Q_{CC} = Q_C(1 - \eta)$ if $\lambda_1 = 0$ and $\lambda_2 = 1$ and the signal $Q_{CC} = Q_C$ in the other cases.

Figure 3:
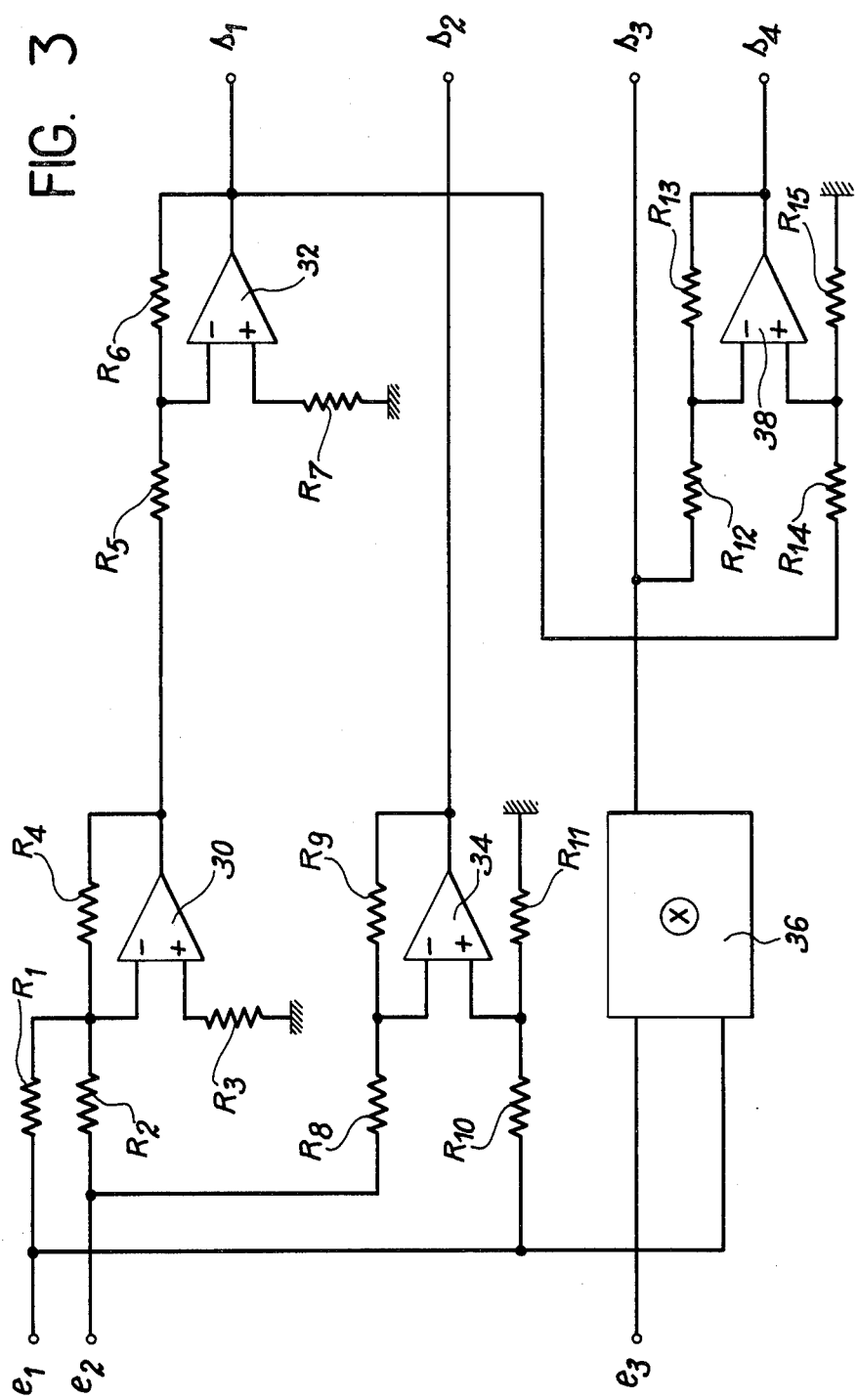
FIG. 3 shows a particular form of construction of the module in accordance with the invention.

The practical construction of the computing module in accordance with the invention does not represent any special problem for anyone who is versed in the art. By way of explanation, the module can be obtained from operational amplifiers as indicated in FIG. 3.

In this figure, the module which is illustrated comprises an adder constituted by an operational amplifier 30, the negative input of which is connected to the inputs $e_1$ and $e_2$ through resistors $R_1$ and $R_2$. Said amplifier is mounted with negative feedback through a resistor $R_4$. The positive input is connected to ground through a resistor $R_3$. Said amplifier delivers at the output a signal $(-E_1 + E_2)$ which is converted to the signal $S_1 = (E_1 + E_2)$ by a circuit having a gain of $-1$ constituted by an operational amplifier 32 mounted with negative feedback through a resistor $R_6$ and connected to the amplifier 30 through a resistor $R_5$. By way of explanation, the resistors $R_1$, $R_2$, $R_4$, $R_5$, $R_6$ can have resistance values of 100 k$\Omega$, the resistor $R_3$ can have a value of 30 k$\Omega$ and the resistor $R_7$ can have a value of 50 k$\Omega$.

The module further comprises a subtracter constituted by an operational amplifier 34, the negative input of which is connected to the input $e_2$ through a resistor $R_8$ and the positive input of which is connected to the input $e_1$ through a resistor $R_{10}$. The amplifier 34 is mounted with negative feedback through a resistor $R_9$ and the positive input is connected to ground through a resistor $R_{11}$. Said resistors $R_8$, $R_9$, $R_{10}$ and $R_{11}$ can all have values of 100 k$\Omega$, for example.

The quadrant multiplier 36 can be of any known type:
the four-quadrant or so-called "parabola" type: it is known that a multiplier of this type is composed of two "absolute value" elements, of two parabolic generators and of a summing device.
of the variable-transconductance type.

Multipliers of this type are well known to those versed in the art and will not be described here.

The fourth circuit can be constituted by an operational amplifier 38, the negative input of which is connected through a resistor $R_{12}$ to the output of the multiplier 36 and the positive input of which is connected through a resistor $R_{14}$ to the output $s_1$. The amplifier 38 is mounted with negative feedback through a resistor $R_{13}$ and the positive output is connected to ground through a resistor $R_{15}$. The resistors $R_{12}$, $R_{13}$, $R_{14}$, $R_{15}$ can have a common value of 100 k$\Omega$.

Solely by way of explanation, the operational amplifiers 30, 32, 34 and 38 can be of the type known as "$\mu$ A 741" manufactured by the Fairchild Company. The multiplier can be of the type known as "MC 15 94L" manufactured by the Motorola Semiconductor Company. The computing voltages of the analog elements can vary between $+10$ V and $-10$ V. The module has an electrical ground (OV) which is common to all the analog and logical elements and connected to the OV of the stabilized supplies. The "1" adopted for the module is equal to 10 V whilst the "0" is the ground of the module. Said module can be constructed in accordance with integrated-circuit technology.

Figure 4:
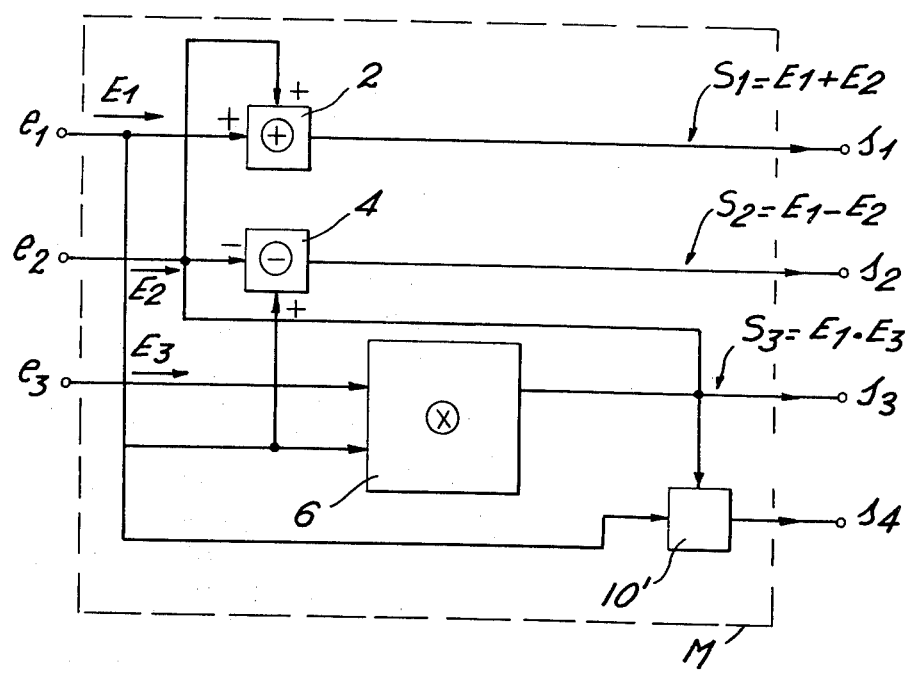
FIG. 4 is a general schematic diagram of a modified computing model in accordance with the invention.

The module illustrated in FIG. 4 is identical to that in FIG. 1 with the exception that the fourth circuit is identified with the reference numeral 10' which may either be an exclusive OR gate, or a NAND gate, or a NOR gate. Two inputs of 10' are connected to $e_1$ and $e_2$ and the output is connected to $s_4$.

TABLE

| | OPERATIONS | Input Signals | | | Output signals | | | |
|---|---|---|---|---|---|---|---|---|
| | | $E_1$ | $E_2$ | $E_3$ | $S_1$ | $S_2$ | $S_3$ | $S_4$ |
| Algebraic | Addition (1) (5) (6) | x | y | $\phi$ | (x+y) | | | |
| | Subtraction (1) (5) (6) | x | y | $\phi$ | | (x−y) | | |
| | Multiplication (1) (2) (3) | x | $\phi$ | y | | | xy | |
| | Inversion (3) | O | y | $\phi$ | | −y | | |
| | Complement to 1 (3) | 1 | y | $\phi$ | | 1−y | | |
| | Division | (S$_4$) | y | x | | | | y/x |
| | Square root | (S$_4$) | y | (S$_4$) | | | | $\sqrt{y}$ |
| Logic | AND (4) | $\lambda$ | $\phi$ | $\mu$ | | | $\lambda.\mu$ | |
| | OR (4) | $\lambda$ | $\mu$ | $\mu$ | | | | $\lambda\vee\mu$ |
| | NOT | 1 | $\mu$ | $\phi$ | | $\bar{\mu}$ | | |
| Hybrid | Active gate (5) | x | $\phi$ | $\lambda$ | | | $(\lambda.x)$ | |
| | Inactive gate | x | $\lambda$ | $(1+x)*$ | | | | $(\bar{\lambda}.x)$ |
| | Active gate | x | $\bar{\lambda}$ | $1+x*$ | | | | $(\lambda.x)$ |
| | Inactive gate | x | $\phi$ | $\lambda *$ | | | $(\bar{\lambda}.x)$ | |

I claim:

1. A computing module having three inputs respectively $e_1$, $e_2$ and $e_3$, and four outputs, respectively $s_1$, $s_2$, $s_3$ and $s_4$, wherein said module comprises:
   a summing circuit with two inputs respectively connected to $e_1$ and $e_2$ and one output connected to $s_1$,
   a first subtracter with two inputs respectively connected to $e_1$ and $e_2$ and one output connected to $s_2$,
   a multiplier with two inputs respectively connected to $e_1$ and $e_3$ and one output connected to $s_3$,
   a second subtracter with two inputs respectively connected to $s_1$ and $s_3$ and one output connected to $s_4$.

2. A computing module having three inputs respectively $e_1$, $e_2$ and $e_3$, and four outputs, respectively $s_1$, $s_2$, $s_3$ and $s_4$, wherein said module comprises:
   a summing circuit with two inputs respectively connected to $e_1$ and $e_2$ and one output connected to $s_1$,
   a subtracter with two inputs respectively connected to $e_1$ and $e_2$ and one output connected to $s_2$,
   a multiplier with two inputs respectively connected to $e_1$ and $e_3$ and one output connected to $s_3$,
   a circuit with two inputs respectively connected to $e_1$ and $e_2$ and with one output connected to $s_4$.

3. A computing module according to claim 1, wherein two of the inputs are connected.

4. A computing module according to claim 1, wherein predetermined outputs are connected to predetermined inputs.

5. A computing module according to claim 2, wherein two of the inputs are connected.

6. A computing module according to claim 2, wherein predetermined outputs are connected to predetermined inputs.

7. A computing module according to claim 2, wherein said last mentioned circuit is a NAND gate.

8. A computing module according to claim 2, wherein said last mentioned circuit is a NOR gate.

9. A computing module according to claim 2, wherein said last mentioned circuit is a NOT gate.

10. A computing module according to claim 2, wherein said last-mentioned circuit is an exclusive -OR gate.

* * * * *